(12) United States Patent
Weigel et al.

(10) Patent No.: US 9,614,113 B2
(45) Date of Patent: Apr. 4, 2017

(54) EDGE PROTECTED BARRIER ASSEMBLIES

(75) Inventors: Mark D. Weigel, Hugo, MN (US);
Mark A. Roehrig, Stillwater, MN (US);
Samuel Kidane, Saint Paul, MN (US);
Michael D. Delmore, Grant, MN (US);
Tracie J. Berniard, Saint Paul, MN (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 0 days.

(21) Appl. No.: 14/236,700

(22) PCT Filed: Jul. 30, 2012

(86) PCT No.: PCT/US2012/048763
§ 371 (c)(1),
(2), (4) Date: Apr. 23, 2014

(87) PCT Pub. No.: WO2013/019695
PCT Pub. Date: Feb. 7, 2013

(65) Prior Publication Data
US 2014/0224327 A1   Aug. 14, 2014

Related U.S. Application Data

(60) Provisional application No. 61/515,043, filed on Aug. 4, 2011.

(51) Int. Cl.
*H01L 31/048* (2014.01)
*H01L 31/049* (2014.01)

(52) U.S. Cl.
CPC ........ *H01L 31/0481* (2013.01); *H01L 31/048* (2013.01); *H01L 31/049* (2014.12); *Y02B 10/12* (2013.01); *Y02E 10/50* (2013.01)

(58) Field of Classification Search
CPC .. H01L 31/0481; H01L 31/048; H01L 31/049
See application file for complete search history.

(56) References Cited

U.S. PATENT DOCUMENTS 3,444,129 A   5/1969   Young
3,460,961 A   8/1969   Young
(Continued)

FOREIGN PATENT DOCUMENTS

CN   1213311   3/1997
CN   1447446   10/2003
(Continued)

OTHER PUBLICATIONS

Mueller, et al., "OH Surface Density of SiO2 and TiO2 by Thermogravimetric Analysis," Langmuir (2003), vol. 19, pp. 160-165.

(Continued)

*Primary Examiner* — Long Pham
(74) *Attorney, Agent, or Firm* — 3M Innovative Properties Company; Carlos M. Téllez

(57) ABSTRACT

The present application is directed to an assembly comprising an electronic device, and a multilayer film. The multilayer film comprises a barrier stack adjacent the electronic device; and a weatherable sheet adjacent the barrier stack opposite the electronic device. The assembly additionally comprises a protective layer in contact with the electronic device and the weatherable sheet. The present application allows for the combination of any of the disclosed elements.

20 Claims, 2 Drawing Sheets

(56) References Cited

U.S. PATENT DOCUMENTS

| | | | |
|---|---|---|---|
| 3,492,261 A | 1/1970 | Young | |
| 3,503,779 A | 3/1970 | Young | |
| 4,329,384 A | 5/1982 | Vesley | |
| 4,330,590 A | 5/1982 | Vesley | |
| 4,379,201 A | 4/1983 | Heilmann | |
| 4,696,719 A | 9/1987 | Bischoff | |
| 4,722,515 A | 2/1988 | Ham | |
| 4,737,559 A | 4/1988 | Kellen | |
| 4,842,893 A | 6/1989 | Yializis | |
| 4,878,993 A | 11/1989 | Rossi | |
| 4,954,371 A | 9/1990 | Yializis | |
| 5,018,048 A | 5/1991 | Shaw | |
| 5,032,461 A | 7/1991 | Shaw | |
| 5,073,611 A | 12/1991 | Rehmer | |
| 5,094,978 A | 3/1992 | Miyagaki | |
| 5,097,800 A | 3/1992 | Shaw | |
| 5,125,138 A | 6/1992 | Shaw | |
| 5,440,446 A | 8/1995 | Shaw | |
| 5,528,102 A | 6/1996 | Gnade | |
| 5,540,978 A | 7/1996 | Schrenk | |
| 5,547,908 A | 8/1996 | Furuzawa | |
| 6,045,864 A | 4/2000 | Lyons | |
| 6,066,226 A | 5/2000 | Nagata | |
| 6,204,443 B1 | 3/2001 | Kiso | |
| 6,214,422 B1 | 4/2001 | Yializis | |
| 6,231,939 B1 | 5/2001 | Shaw | |
| 6,306,507 B1 | 10/2001 | Brunelle | |
| 6,340,403 B1 | 1/2002 | Carey | |
| 6,441,299 B2 | 8/2002 | Otani | |
| 6,522,067 B1 | 2/2003 | Graff | |
| 6,878,400 B2 | 4/2005 | Colombo | |
| 7,018,713 B2 | 3/2006 | Padiyath | |
| 7,198,832 B2 | 4/2007 | Burrows | |
| 7,727,601 B2 | 6/2010 | Burrows | |
| 7,782,420 B2 | 8/2010 | Ohta | |
| 2002/0012761 A1 | 1/2002 | Carlson | |
| 2003/0029493 A1 | 2/2003 | Plessing | |
| 2003/0178056 A1 | 9/2003 | Hikosaka | |
| 2004/0086719 A1 | 5/2004 | Chan | |
| 2004/0195967 A1 | 10/2004 | Padiyath | |
| 2004/0253428 A1 | 12/2004 | Wang | |
| 2005/0156176 A1 | 7/2005 | Gupta | |
| 2005/0224935 A1 | 10/2005 | Schaepkens | |
| 2006/0100299 A1 | 5/2006 | Malik | |
| 2006/0291034 A1 | 12/2006 | Patry | |
| 2007/0164376 A1 | 7/2007 | Burrows | |
| 2008/0023063 A1 | 1/2008 | Hayes | |
| 2008/0053512 A1 | 3/2008 | Kawashima | |
| 2008/0112037 A1 | 5/2008 | Pan et al. | |
| 2008/0216889 A1 | 9/2008 | Blong | |
| 2009/0090412 A1 | 4/2009 | Calwer | |
| 2009/0139564 A1 | 6/2009 | Miyaji | |
| 2009/0288706 A1 | 11/2009 | Ramesh | |
| 2009/0302760 A1 | 12/2009 | Tchakarov | |
| 2010/0089636 A1 | 4/2010 | Ramadas | |
| 2010/0129573 A1 | 5/2010 | Kim | |
| 2010/0143676 A1 | 6/2010 | Hahn | |
| 2010/0148127 A1 | 6/2010 | Ellinger | |
| 2010/0154867 A1 | 6/2010 | Bennison | |
| 2010/0159255 A1 | 6/2010 | Lee | |
| 2010/0202835 A1 | 8/2010 | Jordan | |
| 2010/0272933 A1 | 10/2010 | McCormick | |
| 2011/0127188 A1 | 6/2011 | Thompson | |
| 2011/0132449 A1 | 6/2011 | Ramadas | |
| 2011/0175523 A1 | 7/2011 | Kostka | |
| 2011/0223419 A1 | 9/2011 | Okawara | |
| 2012/0003451 A1 | 1/2012 | Weigel | |
| 2012/0003484 A1 | 1/2012 | Roehrig | |
| 2012/0006401 A1 | 1/2012 | Takanashi | |
| 2012/0024339 A1 | 2/2012 | Eberspacher | |
| 2012/0145240 A1 | 6/2012 | Carcia | |
| 2013/0112272 A1 | 5/2013 | Ackermann | |
| 2014/0179040 A1 | 6/2014 | Ramadas | |
| 2014/0230892 A1* | 8/2014 | Weigel et al. | 136/256 |
| 2014/0246090 A1 | 9/2014 | Weigel | |
| 2014/0283910 A1* | 9/2014 | Weigel et al. | 136/259 |
| 2014/0290736 A1* | 10/2014 | Weigel et al. | 136/256 |
| 2015/0027533 A1 | 1/2015 | Weigel | |

FOREIGN PATENT DOCUMENTS

| | | |
|---|---|---|
| CN | 1771127 | 5/2006 |
| CN | 101188203 | 5/2008 |
| CN | 10272903 | 9/2008 |
| CN | 201616442 | 10/2010 |
| CN | 102057750 | 5/2011 |
| EP | 0554730 | 8/1993 |
| EP | 0631328 | 12/1994 |
| EP | 1150357 | 10/2001 |
| EP | 1351318 | 10/2003 |
| EP | 1548846 | 6/2005 |
| EP | 1938967 | 7/2008 |
| EP | 2289983 | 9/2010 |
| EP | 2448032 | 5/2012 |
| EP | 2730406 | 6/2014 |
| JP | 1989(H01)-223777 | 9/1989 |
| JP | 1993(H05)-269937 | 10/1993 |
| JP | 2000-174296 | 6/2000 |
| JP | 2002-326303 | 11/2002 |
| JP | 2006-173298 | 6/2006 |
| JP | 2009-073071 | 4/2009 |
| JP | 2009-267034 | 11/2009 |
| JP | 2009-277891 | 11/2009 |
| JP | 2011-051195 | 3/2011 |
| JP | 2011-124428 | 6/2011 |
| JP | 2011-129850 | 6/2011 |
| TW | 200418949 | 10/2004 |
| TW | 200508296 | 3/2005 |
| TW | 201034216 | 9/2010 |
| TW | 201115804 | 5/2011 |
| TW | 201121071 | 6/2011 |
| WO | WO 97/33594 | 9/1997 |
| WO | WO 00-26973 | 5/2000 |
| WO | WO 00-61664 | 10/2000 |
| WO | WO 01-81649 | 11/2001 |
| WO | WO 2004-089620 | 10/2004 |
| WO | WO 2005-104266 | 11/2005 |
| WO | WO 2007-071703 | 6/2007 |
| WO | WO 2007-087281 | 8/2007 |
| WO | WO 2008-014492 | 1/2008 |
| WO | WO 2009/086095 | 7/2009 |
| WO | WO 2010-101582 | 9/2010 |
| WO | WO 2010-132448 | 11/2010 |
| WO | WO 2010/0150692 | 12/2010 |
| WO | WO 2010/150759 | 12/2010 |
| WO | WO 2011/010503 | 1/2011 |
| WO | WO 2011/028513 | 3/2011 |
| WO | WO 2011-062932 | 5/2011 |
| WO | WO 2012-030971 | 3/2012 |
| WO | WO 2013-019463 | 2/2013 |
| WO | WO 2013-019466 | 2/2013 |
| WO | WO 2013-019472 | 2/2013 |
| WO | WO 2013-019698 | 2/2013 |
| WO | WO 2013-019763 | 2/2013 |
| WO | WO 2013-130122 | 9/2013 |

OTHER PUBLICATIONS

Vlachopoulou, et al., "A low temperature surface modification assisted method for bonding plastic substrates," J. Micromech. Microeng., (2009), vol. 19 pp. 1-6.

"Electromagnetic Spectrum", Internet Archive Wayback Machine, 2000, 2pgs.

Affinito, "Polymer-Oxide Transparent Barrier Layers", Society of Vacuum Coaters, 39th Annual Technical Conference Proceedings, 1996, pp. 392-397.

Affinito, "Vacuum deposited polymer/metal multilayer films for optical application", Thin Solid Films, 1995, vol. 270, pp. 43-48.

International Search Report for PCT International Application No. PCT/US2012/048763, mailed on Oct. 5, 2012, 2pgs.

Satas, Handbook of Pressure Sensitive Adhesive Technology, 172, (1989).

(56) References Cited

OTHER PUBLICATIONS

Shaw, "A New Vapor Deposition Process for Coating Paper and Polymer Webs", Technical paper presented at the Sixth International Vacuum Web Coating Conference in Reno, Oct. 28, 1992, pp. 18-24.
Shaw, "A New High Speed Process for Vapor Depositing Acrylate Thin Films: An Update", Society of Vacuum Coaters, 36th Annual Technical Conference Proceedings, Dallas, Texas, Apr. 25-30, 1993, pp. 348-352.
Shaw, "Use of Evaporated Acrylate Coatings to Smooth the Surface of Polyester and Polypropylene Film and Aluminium Foil", RadTech'96 North America UV/EB Conference Proceedings, vol. 2, Nashville, Tennessee, Apr. 28-May 2, 1996, pp. 701-707.
Shaw, "Use of Vapor Deposited Acrylate Coatings to Improve the Barrier Properties of Metallized Film", Society of Vacuum Coaters, 37th Annual Technical Conference Proceedings, 1994, pp. 240-247.
Supplementary European Search Report for EP Application No. 12 82 0563 dated Apr. 13, 2015.
Kroschwitz. (Ed.). (1990). Laminates. In *Concise Encyclopedia of Polymer Science and Engineering*. (p. 528). New York, NY: John Wiley & Sons.

* cited by examiner

EDGE PROTECTED BARRIER ASSEMBLIES

CROSS REFERENCE TO RELATED APPLICATIONS

This application is a national stage filing under 35 U.S.C. 371 of International PCT/US2012/048763, filed Jul. 30, 2012, which claims priority to U.S. Provisional Application No. 61/515,043, filed Aug. 4, 2011. The disclosures of both applications are incorporated by reference in their entirety herein.

BACKGROUND

Emerging solar technologies such as organic photovoltaic devices (OPVs) and thin film solar cells like Copper Indium Gallium di-Selenide (CIGS) require protection from water vapor and need to be durable (e.g., to ultra-violet (UV) light) in outdoor environments. Typically, glass has been used as an encapsulating material for such solar devices because glass is a very good barrier to water vapor, is optically transparent, and is stable to UV light. However, glass is heavy, brittle, difficult to make flexible, and difficult to handle. There has been interest in developing transparent flexible encapsulating materials to replace glass that will not share the drawbacks of glass but have glass-like barrier properties and UV stability, and a number of flexible barrier films have been developed that approach the barrier properties of glass.

Solar devices are used outdoors, and so are exposed to the elements, including wind, water and sunlight. Water penetration into solar panels has been a long-standing problem. Solar panels may also be deleteriously affected by wind and sunlight.

Many flexible barrier films are multi-layer film laminates. Any multi-layer film laminate has the potential for delamination, especially at the edges. Reducing delamination at the edges will improve overall performance of the barrier films.

SUMMARY

The present application is directed to an assembly comprising an electronic device, and a multilayer film. The multilayer film comprises a barrier stack adjacent the electronic device; and a weatherable sheet adjacent the barrier stack opposite the electronic device. The assembly additionally comprises a protective layer in contact with the electronic device and the weatherable sheet. The present application allows for the combination of any of the disclosed elements.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

Edge delamination is a concern for multi-layer articles. Slight edge delamination may cause separation of the multiple layers. It has been found that delamination can be controlled by the assessment, control and modification of three inputs. The first input that is assessed is the exposure to light at the interface. The light exposure encompasses visible light in addition to ultraviolet light. Water exposure is the second input. The third input is the stress on an interface. Modification and control of these three input values will reduce spontaneous delamination, or a peel of less than 20 grams/inch as measured according to ASTM D3330 Method A "Standard Test Method for Peel Adhesion of Pressure-Sensitive Tape."

Figure 1:
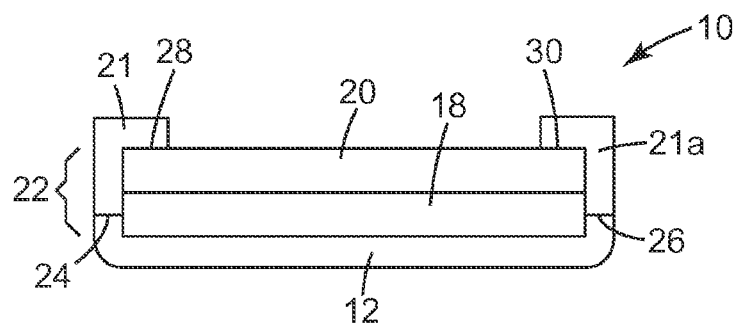
FIG. 1 illustrates an assembly according to an embodiment of the present disclosure using a schematic cross section view.

FIG. 1 illustrates an embodiment according to the present application. Assembly 10 comprises an electronic device 12. A barrier stack 18 is shown adjacent the electronic device 12. The barrier stack comprises multiple layers (not shown) as described herein. A weatherable sheet 20 is adjacent the barrier stack opposite the electronic device. Together, the weatherable sheet 20 and the barrier stack 18 form a multilayer film 22. Protective layers 21 and 21a are bonded to the electronic device 12 at locations 24 and 26 and to the weatherable sheet 20 at locations 28 and 30. This bond can be formed using any method known in the art, including a pressure sensitive adhesive, including surface treatment on the weatherable sheet to allow it to stick to the edge seal material, a primed surface, or a pressure sensitive adhesive.

Figure 2:
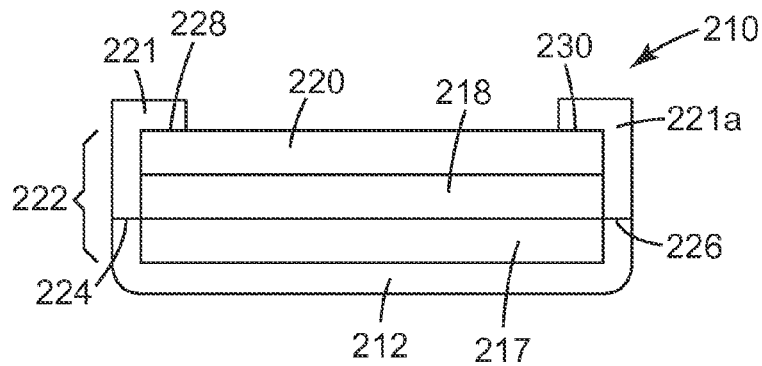
FIG. 2 illustrates an assembly according to a second embodiment of the present disclosure using a schematic cross section view.

FIG. 2 illustrates a second embodiment according to the present application. Assembly 210 comprises an electronic device 212. A barrier stack 218 is shown adjacent the electronic device 212. A substrate 217 is shown between the barrier stack 218 and the electronic device 212. The barrier stack comprises multiple layers (not shown) as described herein. A weatherable sheet 220 is adjacent the barrier stack opposite the electronic device. Together, the weatherable sheet 220, the barrier stack 218 and the substrate 217 form a multilayer film 222. Protective layers 221 and 221a is bonded to the electronic device 212 at locations 224 and 226 and to the weatherable sheet 220 at locations 228 and 230.

Figure 3:
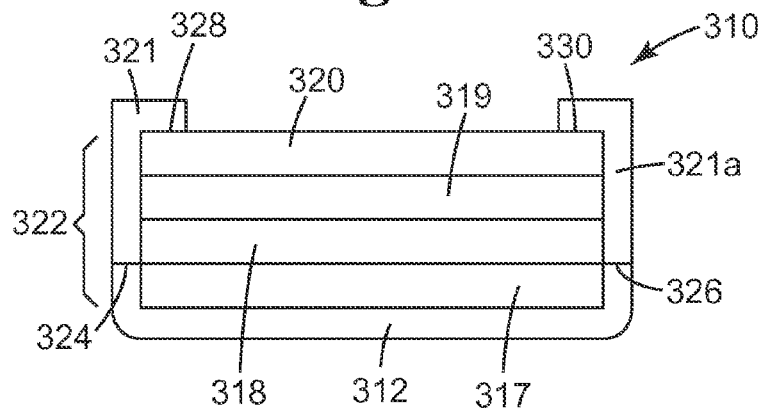
FIG. 3 illustrates an assembly according to a third embodiment of the present disclosure using a schematic cross section view.

FIG. 3 illustrates a third embodiment according to the present application. Assembly 310 comprises an electronic device 312. A barrier stack 318 is shown adjacent the electronic device 312. A substrate 317 is shown between the barrier stack 318 and the electronic device 312. The barrier stack comprises multiple layers (not shown) as described herein. A weatherable sheet 320 is adjacent the barrier stack opposite the electronic device. Together, the weatherable sheet 320, the barrier stack 318 and the substrate 317 form a multilayer film 322. A pressure sensitive adhesive layer 319 is shown between the barrier stack 318 and the weatherable sheet 320 within the multilayer film 322. Protective layers 321 and 321a are bonded to the electronic device 312 at locations 324 and 326 and to the weatherable sheet 320 at locations 328 and 330.

Figure 4:
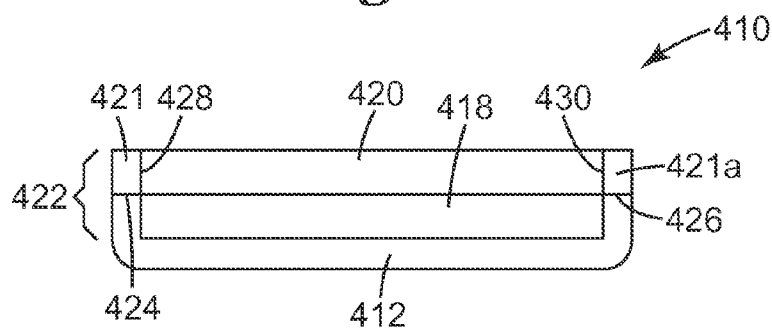
FIG. 4 illustrates an assembly according to a fourth embodiment of the present disclosure using a schematic cross section view.

FIG. 4 illustrates a fourth embodiment according to the present application. Assembly 410 comprises an electronic device 412. A barrier stack 418 is shown adjacent the electronic device 412. The barrier stack comprises multiple layers (not shown) as described herein. A weatherable sheet 420 is adjacent the barrier stack opposite the electronic device. Together, the weatherable sheet 420 and the barrier stack 418 form a multilayer film 422. Protective layers 421 and 421a are bonded to the electronic device at locations 424 and 426 and to the weatherable sheet 420 at locations 428 and 430. In such an embodiment, the multilayer film 428 may additionally include all the layers disclosed in FIGS. 2 and 3.

Figure 5:
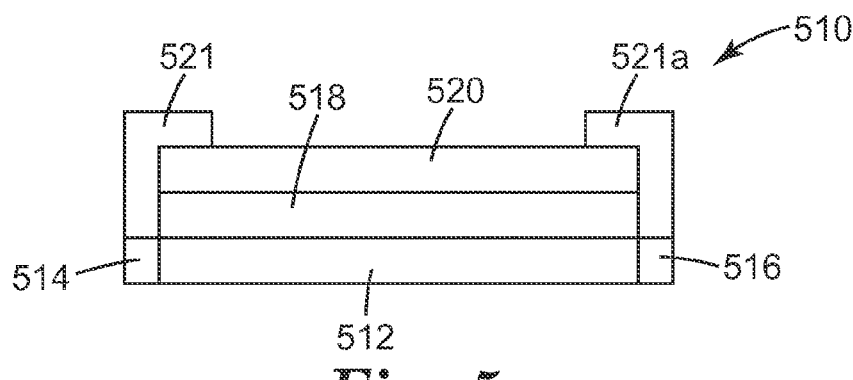
FIG. 5 illustrates an assembly according to a fifth embodiment of the present disclosure using a schematic cross section view.

FIG. 5 illustrates a fifth embodiment according to the present application. Assembly 510 comprises an electronic device 512, barrier stack 518 and weatherable sheet 520. In FIG. 5, the electronic device 512 comprises an edge seal material 514 and 516. The protective layers 521 and 521a are bonded to the electronic device 512 at the edge seal material 514 and 516.

Figure 6:
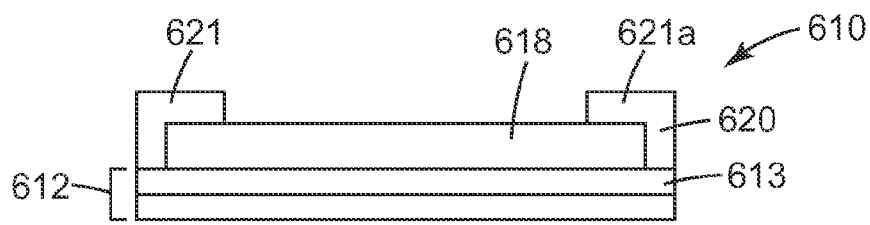
FIG. 6 illustrates an assembly according to a sixth embodiment of the present disclosure using a schematic cross section view.

FIG. 6 illustrates a sixth embodiment according to the present application. Assembly 610 comprises an electronic device 612, barrier stack 618 and weatherable sheet 620. In FIG. 6, the electronic device 612 comprises an encapsulant 613. The protective layers 621 and 621a are bonded to the electronic device 612 at the encapsulant 613.

Figure 7:
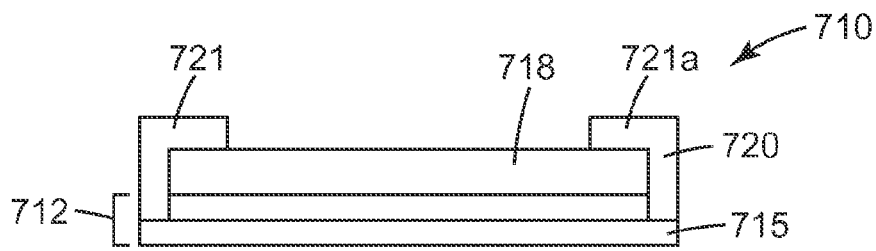
FIG. 7 illustrates an assembly according to a seventh embodiment of the present disclosure using a schematic cross section view.

FIG. 7 illustrates a seventh embodiment according to the present application. Assembly 710 comprises an electronic device 712, barrier stack 718 and weatherable sheet 720. In FIG. 7, the electronic device 712 comprises a backsheet 715. The protective layers 721 and 721a are bonded to the electronic device 712 at the backsheet 715.

The elements in the claims shall be described in more detail below.

Electronic Device

Assemblies according to the present disclosure include, for example, an electronic device, for example solar devices like a photovoltaic cell. Accordingly, the present disclosure provides an assembly comprising a photovoltaic cell. Suitable photovoltaic cells include those that have been developed with a variety of materials each having a unique absorption spectra that converts solar energy into electricity. Examples of materials used to make photovoltaic cells and their solar light absorption band-edge wavelengths include: crystalline silicon single junction (about 400 nm to about 1150 nm), amorphous silicon single junction (about 300 nm to about 720 nm), ribbon silicon (about 350 nm to about 1150 nm), CIS (Copper Indium Selenide) (about 400 nm to about 1300 nm), CIGS (Copper Indium Gallium di-Selenide) (about 350 nm to about 1100 nm), CdTe (about 400 nm to about 895 nm), GaAs multi-junction (about 350 nm to about 1750 nm). The shorter wavelength left absorption band edge of these semiconductor materials is typically between 300 nm and 400 nm. In specific embodiments, the electronic device is a CIGS cell. In some embodiments, the solar device (e.g., the photovoltaic cell) to which the assembly is applied comprises a flexible film substrate, resulting in a flexible photovoltaic device.

The development of methods to prevent separation/delamination of the flexible barrier films in a flexible photovoltaic device are especially valuable to the photovoltaic industry. The longer the photovoltaic module outputs power the more valuable the photovoltaic module. In specific embodiments, the present application is directed to increasing flexible photovoltaic module lifetime, without interfering with barrier properties of a flexible barrier stack.

In some embodiments, the electronic device comprises an encapsulant. An encapsulant is applied over and around the photovoltaic cell and associated circuitry. Presently used encapsulants are ethylene vinyl acetate (EVA), polyvinyl butraldehyde (PVB), polyolefins, thermoplastic urethanes, clear polyvinylchloride, and ionomers. The encapsulant is applied to the solar device, in some embodiments it may include a crosslinker (e.g. a peroxide for EVA) which can crosslink the encapsulant. The encapsulant is then cured in place on the solar device. One example of an encapsulant useful for CIGS photovoltaic modules is sold under the trade designation "JURASOL TL" from Jura-Plast, Reichenschwand, Germany.

In some embodiments, the electronic device comprises an edge seal to seal it at the edges. For example, an edge seal material is applied over and around the sides of the photovoltaic cell and associated circuitry. In some examples, the encapsulant is sealed at the edges. In specific examples, the electronic device, e.g. photovoltaic cell, is already covered with an encapsulant material as described above and a back sheet material and the edges of the entire encapsulated device is sealed. Examples of edge seal materials include dessicated polymers and butyl rubbers such as those sold under the tradenames HELIOSEAL PVS101 from Adco, Lincolnshire, Ill. and SOLARGAIN LP02 edge tape commercially available from TruSeal, Solon, Ohio.

As stated above, in some embodiments, the electronic device comprises a backsheet which fully encapsulates the photovoltaic device from behind as the encapsulant does from the front. Backsheets are typically polymeric films, and in many embodiments are multilayer films. Examples of backsheet films include 3M™ Scotchshield™ Film commercially available from 3M Company, Saint Paul, Minn. The backsheet may be connected to a building material, such as a roofing membrane (for example, in building integrated photovoltaics (BIPV)). For the purpose of the present application, in such an embodiment, the electronic device would comprise such roofing membrane or other part of the roof.

Protective Layers

Examples of protective layers include weatherable tapes. Examples of weatherable tapes include polyvinyl fluoride tapes, such as those commercially available from 3M Company (St. Paul, Minn.) under the tradename SCOTCH BRAND No. 838 TEDLAR PLASTIC FILM TAPE.

These protective layers are especially important around the edges of the assembly, or within 5 mm of the edge. In some embodiments, the protective layers may be placed in a perimeter of the assembly, or forming a frame around the surface of the assembly. Because if the stresses that are focused on the edge, delamination is generally more likely to start there. Once delamination has begun, the edge may advance toward the opposite side of the multi-layer article, eventually resulting in delamination of the entire interface between layers. Stopping the delamination at the edge will allow for the layers in a multilayer article to remain adhered.

Figure 8:
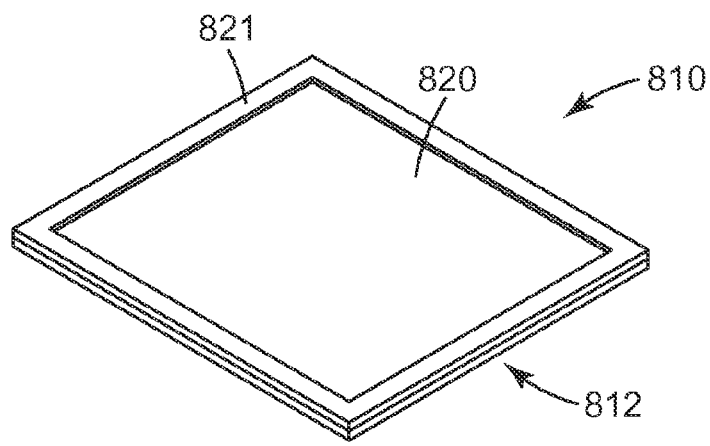
FIG. 8 is an elevated view of an assembly according to the present disclosure.

In some embodiments, the protective layers limit light to the assembly. In such embodiments, the light is limited in a portion of the surface area of the assembly, for example less than 5%, for example less than 1% and in specific examples less than 0.5%. The light can be blocked continuously or in discontinuous pattern, e.g. dots. It may also be beneficial to block light in a perimeter around the assembly. In some embodiments, the protective layer is opaque. For the purpose of the present application, a layer is opaque if it causes a reduction in transmission of visible light (380 to 750 nm), specifically it reduces transmission between 380 and 450 nm, thereby blocking it from reaching the barrier stack. Generally, a layer is opaque if the addition of the layer creates a maximum of 20% transmission at any wavelength between 380 and 450 nm in the multilayer film. In some embodiments, the opaque layer creates a maximum transmission of 2% transmission at any wavelength between 380 and 450 nm. In specific embodiments, the opaque layer creates a maximum transmission of 0.2% transmission at any wavelength between 380 and 450 nm FIG. 8 illustrates an embodiment according to the present application. An assembly 810 shows electronic device 812 and a protective layer 821. Weatherable sheet 820 can be seen from the elevated view. The protective layer 821 is shown surrounding the perimeter of the assembly 810.

Multilayer Film

The multi-layer film generally comprises a barrier stack and a weatherable sheet, and in some embodiments a substrate. The multilayer film is generally transmissive to visible and infrared light. The term "transmissive to visible and infrared light" as used herein can mean having an average transmission over the visible and infrared portion of the spectrum of at least about 75% (in some embodiments at least about 80, 85, 90, 92, 95, 97, or 98%) measured along the normal axis. In some embodiments, the visible and infrared light-transmissive assembly has an average transmission over a range of 400 nm to 1400 nm of at least about 75% (in some embodiments at least about 80, 85, 90, 92, 95, 97, or 98%). Visible and infrared light-transmissive assemblies are those that do not interfere with absorption of visible and infrared light, for example, by photovoltaic cells. In some embodiments, the visible and infrared light-transmissive assembly has an average transmission over a range wavelengths of light that are useful to a photovoltaic cell of at least about 75% (in some embodiments at least about 80, 85, 90, 92, 95, 97, or 98%).

In many embodiments, the multi-layer film is flexible. The term "flexible" as used herein refers to being capable of being formed into a roll. In some embodiments, the term "flexible" refers to being capable of being bent around a roll core with a radius of curvature of up to 7.6 centimeters (cm) (3 inches), in some embodiments up to 6.4 cm (2.5 inches), 5 cm (2 inches), 3.8 cm (1.5 inch), or 2.5 cm (1 inch). In some embodiments, the flexible assembly can be bent around a radius of curvature of at least 0.635 cm (¼ inch), 1.3 cm (½ inch) or 1.9 cm (¾ inch).

Substrate

Assemblies according to the present disclosure comprise a substrate. Generally, the substrate is a polymeric film. In the context of the present application, the term "polymeric" will be understood to include organic homopolymers and copolymers, as well as polymers or copolymers that may be formed in a miscible blend, for example, by co-extrusion or by reaction, including transesterification. The terms "polymer" and "copolymer" include both random and block copolymers.

The substrate may be selected, for example, so that its CTE is about the same (e.g., within about 10 ppm/K) or lower than the CTE of the electronic device (e.g., flexible photovoltaic device). In other words, the substrate may be selected to minimize the CTE mismatch between the substrate and the electronic device. In some embodiments, the substrate has a CTE that is within 20, 15, 10, or 5 ppm/K of the device to be encapsulated. In some embodiments, it may be desirable to select the substrate that has a low CTE. For example, in some embodiments, the substrate has a CTE of up to 50 (in some embodiments, up to 45, 40, 35, or 30) ppm/K. In some embodiments, the CTE of the substrate is in a range from 0.1 to 50, 0.1 to 45, 0.1 to 40, 0.1 to 35, or 0.1 to 30 ppm/K. When the substrate is selected, the difference between the CTE of the substrate and the weatherable sheet (described below) may be, in some embodiments, at least 40, 50, 60, 70, 80, 90, 100, or 110 ppm/K. The difference between the CTE of the substrate and the weatherable sheet may be, in some embodiments, up to 150, 140, or 130 ppm/K. For example, the range of the CTE mismatch between the substrate and the weatherable sheet may be, for example, 40 to 150 ppm/K, 50 to 140 ppm/K, or 80 to 130 ppm/K. The CTE can be determined by thermal mechanical analysis. And the CTE of many substrates can be found in product data sheets or handbooks.

In some embodiments, the substrate has a modulus (tensile modulus) up to $5 \times 10^9$ Pa. The tensile modulus can be measured, for example, by a tensile testing instrument such as a testing system available from Instron, Norwood, Mass., under the trade designation "INSTRON 5900". In some embodiments, the tensile modulus of the substrate is up to $4.5 \times 10^9$ Pa, $4 \times 10^9$ Pa, $3.5 \times 10^9$ Pa, or $3 \times 10^9$ Pa.

In some embodiments, the substrate is heat-stabilized (e.g., using heat setting, annealing under tension, or other techniques) to minimize shrinkage up to at least the heat stabilization temperature when the support is not constrained. Exemplary suitable materials for the substrate include polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), and polyimide, any of which may optionally be heat-stabilized. These materials are reported to have CTEs of in a range from <1 to about 42 ppm/K. Suitable substrates are commercially available from a variety of sources. Polyimides are available, for example, from E.I. Dupont de Nemours & Co., Wilmington, Del., under the trade designation "KAPTON" (e.g., "KAPTON E" or "KAPTON H"); from Kanegafugi Chemical Industry Company under the trade designation "APICAL AV"; from UBE Industries, Ltd., under the trade designation "UPILEX". Polyethersulfones are available, for example, from Sumitomo. Polyetherimides are available, for example, from General Electric Company, under the trade designation "ULTEM". Polyesters such as PET are available, for example, from DuPont Teijin Films, Hopewell, Va.

In some embodiments, the substrate has a thickness from about 0.05 mm to about 1 mm, in some embodiments, from about 0.1 mm to about 0.5 mm or from 0.1 mm to 0.25 mm. Thicknesses outside these ranges may also be useful, depending on the application. In some embodiments, the substrate has a thickness of at least 0.05, 0.06, 0.07, 0.08, 0.09, 0.1, 0.11, 0.12, or 0.13 mm.

Barrier Stack

The multilayer film comprises a barrier stack. Barrier stacks can be selected from a variety of constructions. The term "barrier stack" refers to films that provide a barrier to at least one of oxygen or water. Barrier stacks are typically selected such that they have oxygen and water transmission rates at a specified level as required by the application. In some embodiments, the barrier stack has a water vapor transmission rate (WVTR) less than about 0.005 g/m²/day at 38° C. and 100% relative humidity; in some embodiments, less than about 0.0005 g/m²/day at 38° C. and 100% relative humidity; and in some embodiments, less than about 0.00005 g/m²/day at 38° C. and 100% relative humidity. In some embodiments, the barrier stack has a WVTR of less than about 0.05, 0.005, 0.0005, or 0.00005 g/m²/day at 50° C. and 100% relative humidity or even less than about 0.005, 0.0005, 0.00005 g/m²/day at 85° C. and 100% relative humidity. In some embodiments, the barrier stack has an oxygen transmission rate of less than about 0.005 g/m²/day at 23° C. and 90% relative humidity; in some embodiments, less than about 0.0005 g/m²/day at 23° C. and 90% relative humidity; and in some embodiments, less than about 0.00005 g/m²/day at 23° C. and 90% relative humidity.

Exemplary useful barrier stacks include inorganic films prepared by atomic layer deposition, thermal evaporation, sputtering, and chemical vapor deposition. Useful barrier stacks are typically flexible and transparent.

In some embodiments, useful barrier films comprise inorganic/organic multilayers. Flexible ultra-barrier films comprising inorganic/organic multilayers are described, for example, in U.S. Pat. No. 7,018,713 (Padiyath et al.). Such flexible ultra-barrier films may have a first polymer layer disposed on polymeric film that may be overcoated with two or more inorganic barrier layers separated by additional second polymer layers. In some embodiments, the barrier film comprises one inorganic oxide interposed on a first polymer layer. Useful barrier stacks can also be found, for example, in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); in published PCT Application No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers."

The barrier stack and the substrate are insulated from the environment. For the purpose of the present application, the barrier stack and substrate are insulated when they have no interface with the air surrounding the assembly.

The major surface of the substrate can be treated to improve adhesion to the barrier stack. Useful surface treatments include electrical discharge in the presence of a suitable reactive or non-reactive atmosphere (e.g., plasma, glow discharge, corona discharge, dielectric barrier discharge or atmospheric pressure discharge); chemical pretreatment; or flame pretreatment. A separate adhesion promotion layer may also be formed between the major surface of the substrate and the barrier stack. The adhesion promotion layer can be, for example, a separate polymeric layer or a metal-containing layer such as a layer of metal, metal oxide, metal nitride or metal oxynitride. The adhesion promotion layer may have a thickness of a few nanometers (nm) (e.g., 1 or 2 nm) to about 50 nm or more. In some embodiments, one side (that is, one major surface) of the substrate can be treated to enhance adhesion to the barrier stack, and the other side (that is, major surface) can be treated to enhance adhesion to a device to be covered or an encapsulant (e.g., EVA) that covers such a device. Some useful substrates that are surface treated (e.g., with solvent or other pretreatments) are commercially available, for example, from Du Pont Teijin. For some of these films, both sides are surface treated (e.g., with the same or different pretreatments), and for others, only one side is surface treated.

Weatherable Sheet

Assemblies according to the present disclosure comprise a weatherable sheet, which can be mono or multi-layer. The weatherable sheet is generally flexible and transmissive to visible and infrared light and comprises organic film-forming polymers. Useful materials that can form weatherable sheets include polyesters, polycarbonates, polyethers, polyimides, polyolefins, fluoropolymers, and combinations thereof.

In embodiments wherein the electronic device is, for example, a solar device, it is typically desirable for the weatherable sheet to be resistant to degradation by ultraviolet (UV) light and weatherable. Photo-oxidative degradation caused by UV light (e.g., in a range from 280 to 400 nm) may result in color change and deterioration of optical and mechanical properties of polymeric films. The weatherable sheets described herein can provide, for example, a durable, weatherable topcoat for a photovoltaic device. The substrates are generally abrasion and impact resistant and can prevent degradation of, for example, photovoltaic devices when they are exposed to outdoor elements.

A variety of stabilizers may be added to the weatherable sheet to improve its resistance to UV light. Examples of such stabilizers include at least one of ultra violet absorbers (UVA) (e.g., red shifted UV absorbers), hindered amine light stabilizers (HALS), or anti-oxidants. These additives are described in further detail below. In some embodiments, the phrase "resistant to degradation by ultraviolet light" means that the weatherable sheet includes at least one ultraviolet absorber or hindered amine light stabilizer. In some embodiments, the phrase "resistant to degradation by ultraviolet light" means that the weatherable sheet at least one of reflects or absorbs at least 50 percent of incident ultraviolet light over at least a 30 nanometer range in a wavelength range from at least 300 nanometers to 400 nanometers. In some of these embodiments, the weatherable sheet need not include UVA or HALS.

The UV resistance of the weatherable sheet can be evaluated, for example, using accelerated weathering studies. Accelerated weathering studies are generally performed on films using techniques similar to those described in ASTM G-155, "Standard practice for exposing non-metallic materials in accelerated test devices that use laboratory light sources". The noted ASTM technique is considered a sound predictor of outdoor durability, that is, ranking materials performance correctly. One mechanism for detecting the change in physical characteristics is the use of the weathering cycle described in ASTM G155 and a D65 light source operated in the reflected mode. Under the noted test, and when the UV protective layer is applied to the article, the article should withstand an exposure of at least 18,700 kJ/m² at 340 nm before the b* value obtained using the CIE L*a*b* space increases by 5 or less, 4 or less, 3 or less, or 2 or less before the onset of significant cracking, peeling, delamination or haze.

In some embodiments, the weatherable sheet disclosed herein comprises a fluoropolymer. Fluoropolymers typically are resistant to UV degradation even in the absence of stabilizers such as UVA, HALS, and anti-oxidants. Useful fluoropolymers include ethylene-tetrafluoroethylene copolymers (ETFE), ethylene-chloro-trifluoroethylene copolymers (ECTFE), tetrafluoroethylene-hexafluoropropylene copolymers (FEP), tetrafluoroethylene-perfluorovinylether copolymers (PFA, MFA) tetrafluoroethylene-hexafluoropropylene-vinylidene fluoride copolymers (THV), polyvinylidene fluoride homo and copolymers (PVDF), blends thereof, and blends of these and other fluoropolymers. Fluoropolymers typically comprise homo or copolymers of TFE, CTFE, VDF, HFP or other fully fluorinated, partially fluorinated or hydrogenated monomers such as vinyl ethers and alpa-olefins or other halogen containing monomers.

The CTE of fluoropolymer films is typically high relative to films made from hydrocarbon polymers. For example, the CTE of a fluoropolymer film may be at least 75, 80, 90, 100, 110, 120, or 130 ppm/K. For example, the CTE of ETFE may be in a range from 90 to 140 ppm/K.

The substrates comprising fluoropolymer can also include non-fluorinated materials. For example, a blend of polyvinylidene fluoride and polymethyl methacrylate can be used. Useful flexible, visible and infrared light-transmissive substrates also include multilayer film substrates. Multilayer film substrates may have different fluoropolymers in different layers or may include at least one layer of fluoropolymer and at least one layer of a non-fluorinated polymer. Multilayer films can comprise a few layers (e.g., at least 2 or 3 layers) or can comprise at least 100 layers (e.g., in a range from 100 to 2000 total layers or more). The different polymers in the different multilayer film substrates can be selected, for example, to reflect a significant portion (e.g., at least 30, 40, or 50%) of UV light in a wavelength range from 300 to 400 nm as described, for example, in U.S. Pat. No. 5,540,978 (Schrenk). Such blends and multilayer film substrates may be useful for providing UV resistant substrates that have lower CTEs than the fluoropolymers described above.

Useful weatherable sheets comprising a fluoropolymer can be commercially obtained, for example, from E.I. duPont De Nemours and Co., Wilmington, Del., under the trade designation "TEFZEL ETFE" and "TEDLAR", and films made from resins available from Dyneon LLC, Oakdale, Minn., under the trade designations "DYNEON ETFE", "DYNEON THV", "DYNEON FEP", and "DYNEON PVDF", from St. Gobain Performance Plastics, Wayne, N.J., under the trade designation "NORTON ETFE", from Asahi Glass under the trade designation "CYTOPS", and from Denka Kagaku Kogyo KK, Tokyo, Japan under the trade designation "DENKA DX FILM".

Some useful weatherable sheets other than fluoropolymers are reported to be resistant to degradation by UV light in the absence of UVA, HALS, and anti-oxidants. For example, certain resorcinol isophthalate/terephtalate copolyarylates, for example, those described in U.S. Pat. Nos. 3,444,129; 3,460,961; 3,492,261; and 3,503,779 are reported to be weatherable. Certain weatherable multilayer articles containing layers comprising structural units derived from a 1,3-dihydroxybenzene organodicarboxylate are reported in Int. Pat. App. Pub. No. WO 2000/061664, and certain polymers containing resorcinol arylate polyester chain members are reported in U.S. Pat. No. 6,306,507. Block copolyestercarbonates comprising structural units derived from at least one 1,3-dihydroxybenzene and at least one aromatic dicarboxylic acid formed into a layer and layered with another polymer comprising carbonate structural units are reported in US 2004/0253428. Weatherable sheets containing polycarbonate may have relatively high CTEs in comparison to polyesters, for example. The CTE of a weatherable sheet containing a polycarbonate may be, for example, about 70 ppm/K.

For any of the embodiments of the weatherable sheet described above, the major surface of the weatherable sheet (e.g., fluoropolymer) can be treated to improve adhesion to a pressure sensitive adhesive. Useful surface treatments include electrical discharge in the presence of a suitable reactive or non-reactive atmosphere (e.g., plasma, glow discharge, corona discharge, dielectric barrier discharge or atmospheric pressure discharge); chemical pretreatment (e.g., using alkali solution and/or liquid ammonia); flame pretreatment; or electron beam treatment. A separate adhesion promotion layer may also be formed between the major surface of the weatherable sheet and the PSA. In some embodiments, the weatherable sheet may be a fluoropolymer that has been coated with a PSA and subsequently irradiated with an electron beam to form a chemical bond between the substrate and the pressure sensitive adhesive; (see, e.g., U.S. Pat. No. 6,878,400 (Yamanaka et al.). Some useful weatherable sheets that are surface treated are commercially available, for example, from St. Gobain Performance Plastics under the trade designation "NORTON ETFE".

In some embodiments, the weatherable sheet has a thickness from about 0.01 mm to about 1 mm, in some embodiments, from about 0.05 mm to about 0.25 mm or from 0.05 mm to 0.15 mm.

While the weatherable sheet useful for practicing the present disclosure has excellent outdoor stability, barrier films are required in the assemblies disclosed herein to reduce the permeation of water vapor to levels that allow its use in long term outdoor applications such as building integrated photovoltaic's (BIPV).

Pressure Sensitive Adhesive

A pressure sensitive adhesive ("PSA") may be between the weatherable sheet and the barrier stack. PSAs are well known to those of ordinary skill in the art to possess properties including the following: (1) aggressive and permanent tack, (2) adherence with no more than finger pressure, (3) sufficient ability to hold onto an adherend, and (4) sufficient cohesive strength to be cleanly removable from the adherend. Materials that have been found to function well as PSAs are polymers designed and formulated to exhibit the requisite viscoelastic properties resulting in a desired balance of tack, peel adhesion, and shear holding power.

One method useful for identifying pressure sensitive adhesives is the Dahlquist criterion. This criterion defines a pressure sensitive adhesive as an adhesive having a 1 second creep compliance of greater than $1 \times 10^{-6}$ cm$^2$/dyne as described in "Handbook of Pressure Sensitive Adhesive Technology", Donatas Satas (Ed.), $2^{nd}$ Edition, p. 172, Van Nostrand Reinhold, New York, N.Y., 1989, incorporated herein by reference. Alternatively, since modulus is, to a first approximation, the inverse of creep compliance, pressure sensitive adhesives may be defined as adhesives having a storage modulus of less than about $1 \times 10^6$ dynes/cm$^2$.

PSAs useful for practicing the present disclosure typically do not flow and have sufficient barrier properties to provide slow or minimal infiltration of oxygen and moisture through the adhesive bond line. Also, the PSAs disclosed herein are generally transmissive to visible and infrared light such that they do not interfere with absorption of visible light, for example, by photovoltaic cells. The PSAs may have an average transmission over the visible portion of the spectrum of at least about 75% (in some embodiments at least about 80, 85, 90, 92, 95, 97, or 98%) measured along the normal axis. In some embodiments, the PSA has an average transmission over a range of 400 nm to 1400 nm of at least about 75% (in some embodiments at least about 80, 85, 90, 92, 95, 97, or 98%). Exemplary PSAs include acrylates, silicones, polyisobutylenes, ureas, and combinations thereof. Some useful commercially available PSAs include UV curable PSAs such as those available from Adhesive Research, Inc., Glen Rock, Pa., under the trade designations "ARclear 90453" and "ARclear 90537" and acrylic optically clear PSAs available, for example, from 3M Company, St. Paul, Minn., under the trade designations "OPTICALLY CLEAR LAMINATING ADHESIVE 8171", "OPTICALLY CLEAR LAMINATING ADHESIVE 8172CL", and "OPTICALLY CLEAR LAMINATING ADHESIVE 8172PCL".

In some embodiments, PSAs useful for practicing the present disclosure have a modulus (tensile modulus) up to 50,000 psi ($3.4 \times 10^8$ Pa). The tensile modulus can be measured, for example, by a tensile testing instrument such as a testing system available from Instron, Norwood, Mass., under the trade designation "INSTRON 5900". In some embodiments, the tensile modulus of the PSA is up to 40,000, 30,000, 20,000, or 10,000 psi ($2.8 \times 10^8$ Pa, $2.1 \times 10^8$ Pa, $1.4 \times 10^8$ Pa, or $6.9 \times 10^8$ Pa).

In some embodiments, PSAs useful for practicing the present disclosure are acrylic PSAs. As used herein, the term "acrylic" or "acrylate" includes compounds having at least one of acrylic or methacrylic groups. Useful acrylic PSAs can be made, for example, by combining at least two different monomers (first and second monomers). Exemplary suitable first monomers include 2-methylbutyl acrylate, 2-ethylhexyl acrylate, isooctyl acrylate, lauryl acrylate, n-decyl acrylate, 4-methyl-2-pentyl acrylate, isoamyl acrylate, sec-butyl acrylate, and isononyl acrylate. Exemplary suitable second monomers include a (meth)acrylic acid (e.g., acrylic acid, methacrylic acid, itaconic acid, maleic acid, and fumaric acid), a (meth)acrylamide (e.g., acrylamide, methacrylamide, N-ethyl acrylamide, N-hydroxyethyl acrylamide, N-octyl acrylamide, N-t-butyl acrylamide, N,N-dimethyl acrylamide, N,N-diethyl acrylamide, and N-ethyl-N-dihydroxyethyl acrylamide), a (meth)acrylate (e.g., 2-hydroxyethyl acrylate or methacrylate, cyclohexyl acrylate, t-butyl acrylate, or isobornyl acrylate), N-vinyl pyrrolidone, N-vinyl caprolactam, an alpha-olefin, a vinyl ether, an allyl ether, a styrenic monomer, or a maleate.

Acrylic PSAs may also be made by including cross-linking agents in the formulation. Exemplary cross-linking agents include copolymerizable polyfunctional ethylenically unsaturated monomers (e.g., 1,6-hexanediol diacrylate, trimethylolpropane triacrylate, pentaerythritol tetraacrylate, and 1,2-ethylene glycol diacrylate); ethylenically unsaturated compounds which in the excited state are capable of abstracting hydrogen (e.g., acrylated benzophenones such as described in U.S. Pat. No. 4,737,559 (Kellen et al.), p-acryloxy-benzophenone, which is available from Sartomer Company, Exton, Pa., monomers described in U.S. Pat. No. 5,073,611 (Rehmer et al.) including p-N-(methacryloyl-4-oxapentamethylene)-carbamoyloxybenzophenone, N-(benzoyl-p-phenylene)-N'-(methacryloxymethylene)-carbodiimide, and p-acryloxy-benzophenone); nonionic crosslinking agents which are essentially free of olefinic unsaturation and is capable of reacting with carboxylic acid groups, for example, in the second monomer described above (e.g., 1,4-bis(ethyleneiminocarbonylamino)benzene; 4,4-bis(ethyleneiminocarbonylamino)diphenylmethane; 1,8-bis(ethyleneiminocarbonylamino)octane; 1,4-tolylene diisocyanate; 1,6-hexamethylene diisocyanate, N,N'-bis-1,2-propyleneisophthalamide, diepoxides, dianhydrides, bis(amides), and bis(imides)); and nonionic crosslinking agents which are essentially free of olefinic unsaturation, are noncopolymerizable with the first and second monomers, and, in the excited state, are capable of abstracting hydrogen (e.g., 2,4-bis(trichloromethyl)-6-(4-methoxy)phenyl)-s-triazine; 2,4-bis(trichloromethyl)-6-(3,4-dimethoxy)phenyl)-s-triazine; 2,4-bis(trichloromethyl)-6-(3,4,5-trimethoxy)phenyl)-s-triazine; 2,4-bis(trichloromethyl)-6-(2,4-dimethoxy)phenyl)-s-triazine; 2,4-bis(trichloromethyl)-6-(3-methoxy)phenyl)-s-triazine as described in U.S. Pat. No. 4,330,590 (Vesley); 2,4-bis(trichloromethyl)-6-naphthenyl-s-triazine and 2,4-bis(trichloromethyl)-6-(4-methoxy)naphthenyl-s-triazine as described in U.S. Pat. No. 4,329,384 (Vesley)).

Typically, the first monomer is used in an amount of 80-100 parts by weight (pbw) based on a total weight of 100 parts of copolymer, and the second monomer is used in an amount of 0-20 pbw based on a total weight of 100 parts of copolymer. The crosslinking agent can be used in an amount of 0.005 to 2 weight percent based on the combined weight of the monomers, for example from about 0.01 to about 0.5 percent by weight or from about 0.05 to 0.15 percent by weight.

The acrylic PSAs useful for practicing the present disclosure can be prepared, for example, by a solvent free, bulk, free-radical polymerization process (e.g., using heat, electron-beam radiation, or ultraviolet radiation). Such polymerizations are typically facilitated by a polymerization initiator (e.g., a photoinitiator or a thermal initiator). Examplary suitable photoinitiators include benzoin ethers such as benzoin methyl ether and benzoin isopropyl ether, substituted benzoin ethers such as anisoin methyl ether, substituted acetophenones such as 2,2-dimethoxy-2-phenylacetophenone, and substituted alpha-ketols such as 2-methyl-2-hydroxypropiophenone. Examples of commercially available photoinitiators include IRGACURE 651 and DAROCUR 1173, both available from Ciba-Geigy Corp., Hawthorne, N.Y., and LUCERIN TPO from BASF, Parsippany, N.J. Examples of suitable thermal initiators include, but are not limited to, peroxides such as dibenzoyl peroxide, dilauryl peroxide, methyl ethyl ketone peroxide, cumene hydroperoxide, dicyclohexyl peroxydicarbonate, as well as 2,2-azo-bis(isobutryonitrile), and t-butyl perbenzoate. Examples of commercially available thermal initiators include VAZO 64, available from ACROS Organics, Pittsburgh, Pa., and LUCIDOL 70, available from Elf Atochem North America, Philadelphia, Pa. The polymerization initiator is used in an amount effective to facilitate polymerization of the monomers (e.g., 0.1 part to about 5.0 parts or 0.2 part to about 1.0 part by weight, based on 100 parts of the total monomer content).

If a photocrosslinking agent is used, the coated adhesive can be exposed to ultraviolet radiation having a wavelength of about 250 nm to about 400 nm. The radiant energy in this range of wavelength required to crosslink the adhesive is about 100 millijoules/cm$^2$ to about 1,500 millijoules/cm$^2$, or more specifically, about 200 millijoules/cm$^2$ to about 800 millijoules/cm$^2$.

A useful solvent-free polymerization method is disclosed in U.S. Pat. No. 4,379,201 (Heilmann et al.). Initially, a mixture of first and second monomers can be polymerized with a portion of a photoinitiator by exposing the mixture to UV radiation in an inert environment for a time sufficient to form a coatable base syrup, and subsequently adding a crosslinking agent and the remainder of the photoinitiator. This final syrup containing a crosslinking agent (e.g., which may have a Brookfield viscosity of about 100 centipoise to about 6000 centipoise at 23 C, as measured with a No. 4 LTV spindle, at 60 revolutions per minute) can then be coated onto the weatherable sheet. Once the syrup is coated onto the weatherable sheet, further polymerization and crosslinking can be carried out in an inert environment (e.g., nitrogen, carbon dioxide, helium, and argon, which exclude oxygen). A sufficiently inert atmosphere can be achieved by covering a layer of the photoactive syrup with a polymeric film, such as silicone-treated PET film, that is transparent to UV radiation or e-beam and irradiating through the film in air.

In some embodiments, PSAs useful for practicing the present disclosure comprise polyisobutylene. The polyisobutylene may have a polyisobutylene skeleton in the main or a side chain. Useful polyisobutylenes can be prepared, for example, by polymerizing isobutylene alone or in combination with n-butene, isoprene, or butadiene in the presence of a Lewis acid catalyst (for example, aluminum chloride or boron trifluoride).

Useful polyisobutylene materials are commercially available from several manufacturers. Homopolymers are commercially available, for example, under the trade designations "OPPANOL" and "GLISSOPAL" (e.g., OPPANOL B15, B30, B50, B100, B150, and B200 and GLISSOPAL 1000, 1300, and 2300) from BASF Corp. (Florham Park, N.J.); "SDG", "JHY", and "EFROLEN" from United Chemical Products (UCP) of St. Petersburg, Russia. Polyisobutylene copolymers can be prepared by polymerizing isobutylene in the presence of a small amount (e.g., up to 30, 25, 20, 15, 10, or 5 weight percent) of another monomer such as, for example, styrene, isoprene, butene, or butadiene. Exemplary suitable isobutylene/isoprene copolymers are commercially available under the trade designations "EXXON BUTYL" (e.g., EXXON BUTYL 065, 068, and 268) from Exxon Mobil Corp., Irving, Tex.; "BK-1675N" from UCP and "LANXESS" (e.g., LANXESS BUTYL 301, LANXESS BUTYL 101-3, and LANXESS BUTYL 402) from Sarnia, Ontario, Canada. Exemplary suitable isobutylene/styrene block copolymers are commercially available under the trade designation "SIBSTAR" from Kaneka (Osaka, Japan). Other exemplary suitable polyisobutylene resins are commercially available, for example, from Exxon Chemical Co. under the trade designation "VISTANEX", from Goodrich Corp., Charlotte, N.C., under the trade designation "HYCAR", and from Japan Butyl Co., Ltd., Kanto, Japan, under the trade designation "JSR BUTYL".

A polyisobutylene useful for practicing the present disclosure may have a wide variety of molecular weights and a wide variety of viscosities. Polyisobutylenes of many different molecular weights and viscosities are commercially available.

In some embodiments of PSAs comprising polyisobutylene, the PSA further comprises a hydrogenated hydrocarbon tackifier (in some embodiments, a poly(cyclic olefin)). In some of these embodiments, about 5 to 90 percent by weight the hydrogenated hydrocarbon tackifier (in some embodiments, the poly(cyclic olefin)) is blended with about 10 to 95 percent by weight polyisobutylene, based on the total weight of the PSA composition. Useful polyisobutylene PSAs include adhesive compositions comprising a hydrogenated poly(cyclic olefin) and a polyisobutylene resin such as those disclosed in Int. Pat. App. Pub. No. WO 2007/087281 (Fujita et al.).

The "hydrogenated" hydrocarbon tackifier component may include a partially hydrogenated resin (e.g., having any hydrogenation ratio), a completely hydrogenated resin, or a combination thereof. In some embodiments, the hydrogenated hydrocarbon tackifier is completely hydrogenated, which may lower the moisture permeability of the PSA and improve the compatibility with the polyisobutylene resin. The hydrogenated hydrocarbon tackifiers are often hydrogenated cycloaliphatic resins, hydrogenated aromatic resins, or combinations thereof. For example, some tackifying resins are hydrogenated C9-type petroleum resins obtained by copolymerizing a C9 fraction produced by thermal decomposition of petroleum naphtha, hydrogenated C5-type petroleum resins obtained by copolymerizing a C5 fraction produced by thermal decomposition of petroleum naphtha, or hydrogenated C5/C9-type petroleum resins obtained by polymerizing a combination of a C5 fraction and C9 fraction produced by thermal decomposition of petroleum naphtha. The C9 fraction can include, for example, indene, vinyltoluene, alpha-methylstyrene, beta-methylstyrene, or a combination thereof. The C5 fraction can include, for example, pentane, isoprene, piperine, 1,3-pentadiene, or a combination thereof. In some embodiments, the hydrogenated hydrocarbon tackifier is a hydrogenated poly(cyclic olefin) polymer. In some embodiments, the hydrogenated poly(cyclic olefin) is a hydrogenated poly(dicyclopentadiene), which may provide advantages to the PSA (e.g., low moisture permeability and transparency). The tackifying resins are typically amorphous and have a weight average molecular weight no greater than 5000 grams/mole.

Some suitable hydrogenated hydrocarbon tackifiers are commercially available under the trade designations "ARKON" (e.g., ARKON P or ARKON M) from Arakawa Chemical Industries Co., Ltd. (Osaka, Japan); "ESCOREZ" from Exxon Chemical; "REGALREZ" (e.g., REGALREZ 1085, 1094, 1126, 1139, 3102, and 6108) from Eastman (Kingsport, Tenn.); "WINGTACK" (e.g., WINGTACK 95 and RWT-7850) resins from Cray Valley (Exton, Pa.); "PICCOTAC" (e.g., PICCOTAC 6095-E, 8090-E, 8095, 8595, 9095, and 9105) from Eastman; "CLEARON", in grades P, M and K, from Yasuhara Chemical, Hiroshima, Japan; "FORAL AX" and "FORAL 105" from Hercules Inc., Wilmington, Del.; "PENCEL A", "ESTERGUM H", "SUPER ESTER A", and "PINECRYSTAL" from Arakawa Chemical Industries Co., Ltd., Osaka, Japan; from Arakawa Chemical Industries Co., Ltd.); "EASTOTAC H" from Eastman; and "IMARV" from Idemitsu Petrochemical Co., Tokyo, Japan.

Optionally PSAs useful for practicing the present disclosure (including any of the embodiments of PSAs described above) comprise at least one of a uv absorber (UVA), a hindered amine light stabilizer, or an antioxidant. Examples of useful UVAs include those described above in conjunction with multilayer film substrates (example. g., those available from Ciba Specialty Chemicals Corporation under the trade designations "TINUVIN 328", "TINUVIN 326", "TINUVIN 783", "TINUVIN 770", "TINUVIN 479", "TINUVIN 928", and "TINUVIN 1577"). UVAs, when used, can be present in an amount from about 0.01 to 3 percent by weight based on the total weight of the pressure sensitive adhesive composition. Examples of useful antioxidants include hindered phenol-based compounds and phosphoric acid ester-based compounds and those described above in conjunction with multilayer film substrates (e.g., those available from Ciba Specialty Chemicals Corporation under the trade designations "IRGANOX 1010", "IRGANOX 1076", and "IRGAFOS 126" and butylated hydroxytoluene (BHT)). Antioxidants, when used, can be present in an amount from about 0.01 to 2 percent by weight based on the total weight of the pressure sensitive adhesive composition. Examples of useful stabilizers include phenol-based stabilizers, hindered amine-based stabilizers (e.g., including those described above in conjunction with multi-layer film substrates and those available from BASF under the trade designation "CHIMASSORB" such as "CHIMASSORB 2020"), imidazole-based stabilizers, dithiocarbamate-based stabilizers, phosphorus-based stabilizers, and sulfur ester-based stabilizers. Such compounds, when used, can be present in an amount from about 0.01 to 3 percent by weight based on the total weight of the pressure sensitive adhesive composition.

In some embodiments, the PSA layer disclosed herein is at least 0.005 mm (in some embodiments, at least 0.01, 0.02, 0.03, 0.04, or 0.05 mm) in thickness. In some embodiments, the PSA layer has a thickness up to about 0.2 mm (in some embodiments, up to 0.15, 0.1, or 0.075 mm) in thickness. For example, the thickness of the PSA layer may be in a range from 0.005 mm to 0.2 mm, 0.005 mm to 0.1 mm, or 0.01 to 0.1 mm.

Once the PSA layer has been applied to the weatherable sheet, the exposed major surface may be temporarily protected with a release liner before being applied to a barrier film disclosed herein. Examples of useful release liners include craft paper coated with, for example, silicones; polypropylene film; fluoropolymer film such as those available from E.I. du Pont de Nemours and Co. under the trade designation "TEFLON"; and polyester and other polymer films coated with, for example, silicones or fluorocarbons.

A variety of stabilizers may be added to the PSa layer to improve its resistance to UV light. Examples of such stabilizers include at least one of ultra violet absorbers (UVA) (e.g., red shifted UV absorbers), hindered amine light stabilizers (HALS), or anti-oxidants.

Without wanting to be bound be theory, it is believed that the PSA layer in the barrier assembly according to the present disclosure serves to protect the barrier assembly from thermal stresses that may be caused by a high CTE weatherable sheet (e.g., a fluoropolymer). Furthermore, even in embodiments wherein the CTE mismatch between the first and weatherable sheets is relatively low (e.g., less than 40 ppm/K) the PSA layer serves as a convenient means for attaching the weatherable sheet to the barrier film deposited on the first polymeric film substrate (e.g., having a CTE of up to 50 ppm/K). When the PSA layer contains at least one of UVA, HALS, or anti-oxidants, it can further provide protection to the barrier film from degradation by UV light.

Other Optional Features

Optionally, assemblies according to the present disclosure can contain desiccant. In some embodiments, assemblies according to the present disclosure are essentially free of desiccant. "Essentially free of desiccant" means that desiccant may be present but in an amount that is insufficient to effectively dry a photovoltaic module. Assemblies that are essentially free of desiccant include those in which no desiccant is incorporated into the assembly.

Various functional layers or coatings can optionally be added to the assemblies disclosed herein to alter or improve their physical or chemical properties. Exemplary useful layers or coatings include visible and infrared light-transmissive conductive layers or electrodes (e.g., of indium tin oxide); antistatic coatings or films; flame retardants; abrasion resistant or hardcoat materials; optical coatings; anti-fogging materials; anti-reflection coatings; anti-smudging coatings; polarizing coatings; anti-fouling materials; prismatic films; additional adhesives (e.g., pressure sensitive adhesives or hot melt adhesives); primers to promote adhesion to adjacent layers; additional UV protective layers; and low adhesion backsize materials for use when the barrier assembly is to be used in adhesive roll form. These components can be incorporated, for example, into the barrier film or can be applied to the surface of the polymeric film substrate.

Other optional features that can be incorporated into the assembly disclosed herein include graphics and spacer structures. For example, the assembly disclosed herein could be treated with inks or other printed indicia such as those used to display product identification, orientation or alignment information, advertising or brand information, decoration, or other information. The inks or printed indicia can be provided using techniques known in the art (e.g., screen printing, inkjet printing, thermal transfer printing, letterpress printing, offset printing, flexographic printing, stipple printing, and laser printing). Spacer structures could be included, for example, in the adhesive, to maintain specific bond line thickness.

Assemblies according to the present disclosure can conveniently be assembled using a variety of techniques. For example, the pressure sensitive adhesive layer may be a transfer PSA on a release liner or between two release liners. The transfer adhesive can be used to laminate a weatherable sheet to a barrier film deposited on a weatherable sheet after removal of the release liner(s). In another example, a PSA can be coated onto the weatherable sheet and/or onto the barrier film deposited on the first polymeric film substrate before laminating the first and weatherable sheets together. In a further example, a solvent-free adhesive formulation, for example, can be coated between the weatherable sheet and the barrier film deposited on the first polymeric film substrate. Subsequently, the formulation can be cured by heat or radiation as described above to provide an assembly according to the present disclosure.

Embodiments and advantages of this disclosure are further illustrated by the following non-limiting examples, but the particular materials and amounts thereof recited in these examples, as well as other conditions and details, should not be construed to unduly limit this disclosure.

The present application is directed to an assembly comprising an electronic device, and a multilayer film. The multilayer film comprises a barrier stack adjacent the electronic device; and a weatherable sheet adjacent the barrier stack opposite the electronic device. The assembly additionally comprises a protective layer in contact with the electronic device and the weatherable sheet.

The present application allows for the combination of any of the disclosed elements.

EXAMPLES

Example 1

An example of the inventive assembly with a simulated electronic device, edge seal, multilayer film, weathearable sheet and a protective layer in contact with the edge seal material was constructed in the following manner A sheet of "UBF 9L" barrier film laminate available from 3M Company, St. Paul, Minn. (17 cm (6.5 in) wide×24 cm (9.5 in) long) was placed with the weatherable surface down to simulate a low water vapor transmission rate (WVTR) backsheet. A 12 mm (½ in) wide strip of edge seal material 1.0 mm thick commercially available from under the trade designation "HELIOSEAL PVS 101" from Adco, Lincolnshire, Ill. was placed around the entire perimeter of the "UBF 9L" barrier film laminate opposite the weatherable surface of the "UBF 9L" barrier film laminate. An encapsulant material, commercially available under the trade designation "JURASOL TL" (0.4 mm thick) from Jura-Plast, Reichenschwand, Germany was cut into a 14 cm (5.5 in)×22 cm (8.5 in) sheet and placed inside of the edge seal material on top of the "UBF 9L" barrier film laminate, opposite the weatherable surface. A polytetrafluoroethylene (PTFE) coated 140 micron (5.6 mil) aluminum foil, commercially available from McMaster-Carr Princeton, N.J. was cut into a 13 cm (5.0 in)×20 cm (8.0 in) sheet and placed on top of the "JURASOL TL" encapsulant with the PTFE coated side facing up. This material was placed in the assembly to simulate a flexible electronic device. Another sheet of the same encapsulant material was cut into a 14 cm (5.5 in)×22 (8.5 in) sheet and placed on top of the PTFE coated aluminum foil. Another sheet of "UBF 9L" barrier film laminate was cut to 15 cm (6.0 in)×23 cm (9.0 in), orientated with the weatherable surface up and placed to cover the "JURASOL TL" encapsulant plus 6.4 mm (0.25 in) around the entire perimeter of the edge seal material. After placement of the "UBF 9L" barrier film laminate topsheet, 12 mm (0.47 in) of a polyvinyl fluoride (PVF) tape commercially available under the trade designation "SCOTCH BRAND No. 838 TEDLAR PLASTIC FILM TAPE" from 3M Company, St. Paul, Minn. was adhered directly over the edge seal perimeter, thereby covering the remaining exposed edge seal and 6.4 mm (0.25 in) of the "UBF 9L" barrier film laminate edge.

The entire assembly was placed in a Spire 350 Vacuum Laminator (commercially available from Spire Corporation Bedford, Mass.) and cured at 150° C. for 12 min.

The resulting assembly was visually intact and meant to simulate an electronic device comprising an opaque protective layer in contact with the edge seal material and the weatherable sheet.

A T-peel test was then used to measure the adhesion of the PVF tape to 2 different edge seal materials, "HELIOSEAL PVS 101" (12 mm wide×1.0 mm thick) from Adco, Lincolnshire, Ill. and "SOLARGAIN LP02" (12.7 mm wide× 1.0 mm thick) edge tape commercially available from Tru-Seal, Solon, Ohio. "SCOTCH BRAND No. 838 TEDLAR PLASTIC FILM TAPE" was cut into 1.9 cm (¾ in)×15 cm (6 in) rectangular sections. These sections were then adhered on both sides of a 1.3 cm (½ in)×13 cm (5 in) strip of edge seal with the pressure sensitive adhesive facing the edge seal material. This peel strip construction was laminated at 150° C. for 12 min and $10^5$ Pa (1 atm) of pressure. The resulting laminate was then tested in the T-Peel test according to AST D18776-08. The two unbonded ends of the PVF tape were placed in a tension testing machine according to ASTM D1876-08 "Standard Test Method for Peel Resistance of Adhesives (T-Peel Test)". A grip distance of 12.7 mm was used and a peel speed of 254 mm/min (10 in/min) was used. T-Peel testing was completed according to ASTM D1876-08 except where otherwise stated. The average peel force was measured for five samples of the edge seal bonding material and averaged to produce the following results:

"HELIOSEAL PVS 101" measured 3.6 N/mm (20 lbs/in)
"SOLARGAIN LP02" measured 1.3 N/mm (8.3 lbs/in)

Example 2

An example of a barrier assembly comprising a protective layer in contact with an edge seal material and the weatherable sheet was prepared as Example 1, except a black RTV silicone caulk available from CRC Industries, Inc. Warminster, Pa. was applied in place of the PVF tape after the assembly was cured in the laminator. The caulk was applied first as a bead covering the weatherable sheet and edge seal followed by further spreading using a wood tongue depressor to fully cover the remaining edge seal and about 6 mm (0.25 in) of the weatherable topsheet. The caulk was then allowed to cure at room temperature per the manufacturer's instructions.

The resulting assembly was visually intact and meant to simulate an electronic device comprising a curable resin protective layer in contact with the edge seal material and the weatherable sheet.

All patents and publications referred to herein are hereby incorporated by reference in their entirety. Various modifications and alterations of this disclosure may be made by those skilled in the art without departing from the scope and spirit of this disclosure, and it should be understood that this disclosure is not to be unduly limited to the illustrative embodiments set forth herein.

What is claimed is:

1. An assembly comprising
an electronic device; and
a multilayer film, the multilayer film comprising
a barrier stack adjacent the electronic device; and
a polymer weatherable sheet adjacent the barrier stack opposite the electronic device, and a protective layer in contact with the electronic device and the weatherable sheet.

2. The assembly of claim 1 wherein the barrier stack comprises a polymer layer and an inorganic barrier layer.

3. The assembly of claim 2 wherein the inorganic barrier layer is an oxide layer.

4. The assembly of claim 1 wherein the multilayer film comprises a substrate between the electronic device and the barrier stack.

5. The assembly of claim 1 wherein the electronic device comprises an edge seal material.

6. The assembly of claim 5 wherein the protective layer is in contact with the edge seal.

7. The assembly of claim 1 wherein the protective layer is in contact with the barrier stack.

8. The assembly of claim 1 wherein the protective layer is a weatherable tape.

9. The assembly of claim 1 wherein the protective layer is a mechanical junction.

10. The assembly of claim 1 wherein the protective layer is a curable resin.

11. The assembly of claim 1 wherein the protective layer is bonded to the weatherable sheet.

12. The assembly of claim 4 wherein the substrate comprises at least one of polyethylene terephthalate, polyethylene naphthalate, polyetheretherketone, polyaryletherketone, polyacrylate, polyetherimide, polyarylsulfone, polyethersulfone, polyamideimide, or polyimide.

13. The assembly of claim 1 wherein the weatherable sheet comprises a fluoropolymer.

14. The assembly of claim 13 wherein the fluoropolymer comprises at least one of an ethylene tetrafluoro-ethylene copolymer, a tetrafluoroethylene-hexafluoropropylene copolymer, a tetrafluoroethylene-hexafluoropropylene-vinylidene fluoride copolymer, or a polyvinylidene fluoride.

15. The assembly of claim 1 comprising a pressure sensitive adhesive layer between the weatherable sheet and the barrier stack.

16. The assembly of claim 1 wherein the barrier stack oxide layer shares a siloxane bond with the barrier stack polymer layer.

17. The assembly of claim 1 wherein the electronic device is a photovoltaic cell.

18. The assembly of claim 4 wherein the substrate is heat stabilized.

19. The assembly of claim 1 wherein the barrier stack has a water vapor transmission rate of less than 0.005 cc/m$^2$/day at 50° C. and 100% relative humidity.

20. The assembly of claim 1 wherein the barrier stack has an oxygen transmission rate of less than 0.005 cc/m$^2$/day at 23° C. and 90% relative humidity.

* * * * *